INVENTOR.
JEARLD L. HUTSON
BY Robert C Peterson
ATTORNEY

INVENTOR.
JEARLD L. HUTSON
BY Robert C Peterson
ATTORNEY 3,317,746
SEMICONDUCTOR DEVICE AND CIRCUIT Jearld L. Hutson, Richardson, Tex., assignor to Electronic Control Corporation, Euless, Tex., a corporation of Texas Filed Dec. 10, 1963, Ser. No. 329,513
16 Claims. (Cl. 307—88.5)

This invention relates to a multilayer semiconductor device, and more particularly the invention relates to a bi-directional triode thyristor suitable as a power switch and capable of initially supplying power to a load through the starting circuit impedance of the device and then automatically shunting the starting circuit impedance out of the load current circuit. More specifically, the invention relates to a bi-directional symmetrical triode power switch and associated power and control circuits appertaining thereto.

Various power control switches in the semiconductor field such as silicon control rectifiers (SCR) and silicon control switches (SCS) have been developed and used as motor speed controls, light dimmer controls, etc. However, such devices have had undesirable features in their circuit designs, such as cycle instability, which have not been eliminated. Also, such devices have been limited generally to switching in one direction only. Further developments such as the four and five layer diodes have eliminated some circuit design problems, now providing bilateral switching, but added others such as inherently placing the starting impedance in the load circuit.

The invention herein provides a bilateral triode switch which permits switching from high to low to high impedance in both directions through the device. Essentially, the triode switch of the invention is a five layer diode having regions of both N and P-type conductivity material on each side or end surface thereof. At each end surface the N- and P-type conductivity material are electrically shorted by a contact which covers a portion of both types of material. Hence, electrically biased in either direction the device appears as an NPNP diode impedance. Furthermore, a moat or channel is etched into one side or end of the device just into the center layer or region leaving an isolated plateau or island separated by a moat or channel from the remaining region of the device but contiguous with the center region, forming a P–N junction therewith. With the two contacts remaining on the end surfaces and the island electrode, the device forms a triode structure. The island portion may contain P- and N-type conductivity material or solely P-type material or solely N-type material.

In operation as a typical A.C. power control device, when an A.C. power line voltage is applied between the end surface contacts (one adjacent and one opposite the island) of the device, and a starting voltage, developed with a synchronous phase relation to the power line voltage, is impressed across the island and adjacent surface contact; a leakage current flows between the island or plateau electrode and the adjacent surface contact, as well as between the opposite and adjacent electrodes. The island or starting voltage in conjunction with the power line voltage establishes a breakover voltage potential appropriate to produce current flow first between either the contact opposite or adjacent the island of the device and the island, and then between the contacts opposite and adjacent with respect to the island, thus switching the main device to the on-state and supplying current to a load in series with the adjacent and opposite contacts or power electrodes of the bilateral triode switch. Once current begins flowing between the surface opposite the island and the surface adjacent the island substantially the entire amount of load current flows therethrough, and very little, if any, current flows through the island, and hence, the starting impedance coupled therewith. After the triode thyristor is in the on-state, the power line voltage cycling establishes the cut-off point. The turn-on sequence occurs for each half-cycle. Thus, the device of the invention provides a bilateral triode switch power switch.

In another aspect of the invention, a phase shift and pulse forming network or switching circuit is provided in conjunction with the symmetrical triode thyristor device to produce the desired off-on time for the triode thyristor. The logic circuit is designed to produce a controlled starting or switching voltage, synchronized in phase relation with the power voltage, being supplied and impressed between the island or plateau electrode and the adjacent surface electrode of the triode thyristor. Preferably, the starting impedance, which couples the switching or control voltage across the island electrode and its adjacent electrode, is provided by an inductive couple from the switching circuit. Because the starting inductive impedance conducts a relatively insignificant portion of the load current, the $I^2R$ heating is substantially eliminated as well as RF current created by high peak voltages in parallel with the power line. The switching circuit provides an adjustable on-time control to the switch by utilization of a phase shift network. The bilateral triode switch may be made from any suitable semiconductor material, however, silicon is the preferred semiconductor crystal. Also, the wafer may either be N-type with P-type diffused regions on both sides thereof and N-type diffused regions in portions of both P-type regions thereof, or the wafer may be P-type with N-type diffused regions and P-type diffused regions in the N-type diffused regions. The island portion of the wafer may contain either N- and P-type conductivity regions, or all P-type conductivity region, or all N-type conductivity region, or both P- and N-type conductivity regions shorted together.

It is therefore an object of the invention to provide a bilateral triode switch semiconductor device capable of off-on switching of large power circuits in synchronization and at relatively high temperatures without exceeding the material limits and having excessive $I^2R$ heating of the input impedance circuit;

It is another object of the invention to provide a bilateral triode switch in which the starting impedance does not consume a significant amount of power being supplied to the load;

It is yet another object of the invention to provide a symmetrical bilateral triode switch semiconductor device comprising a single crystal semiconductor having a central region; intermediate regions and outer regions on each side of the central region, the intermediate regions of opposite-type conductivity than the central region and the outer regions of like type conductivity as the central region; a discrete region isolated from all but the central region forming a PN junction therewith, the discrete region juxtaposed to contiguous intermediate and outer regions; and a pair of contacts, each contact shunting contiguous intermediate and outer regions and an electrical contact to the discrete region;

It is yet another object of the invention to provide a symmetrical bilateral triode switch semiconductor device comprising a five layer semiconductor body, alternate layers being of opposite-type conductivity, a discrete region defined within said body contiguous with the innermost layer thereof and formed within at least the region contiguous therewith, a pair of power contacts, each contact shunting portions of an outer layer and the layer contiguous therewith at the PN junction therebetween, and a contact on the discrete region for applying a control signal thereto;

Still another object of the invention is to provide a bilateral triode switch which essentially decouples its starting impedance from the load current circuit yet is capable of initiating the necessary breakover voltage for switching the device;

Still another object of the invention is to provide a symmetrical bilateral triode switch power control circuit which provides sufficient additional voltage, synchronized with the load voltage, at the island or control electrode of the device to achieve the breakover voltage, the circuit eliminating $I^2R$ heating in the starting impedance circuit by automatically switching the starting impedance out of the load current circuit;

It is still another object of the invention to provide a bilateral triode switch power control switch logic circuit to generate the voltage necessary in conjunction with the line voltage to impress a breakover voltage across the bilateral triode switch adjusted in phase yet synchronized with the line voltage to establish an adjustable on-time cycle for the power switch;

A further object of the invention is to provide a bilateral triode switch power switch circuit which generates the additional voltage, in conjunction with the line voltage, necessary to impress a breakover voltage across the power switch in synchronism with the line voltage at an adjustable phase relation to provide on-time control of the power switch, yet effectively isolates the load current circuit from the starting impedance circuit which couples such additional voltage across the triode thyristor.

These and other objects and advantages of the invention will become apparent from the detailed descriptions and appended claims in conjunction with the following drawings wherein;

Figure 1:
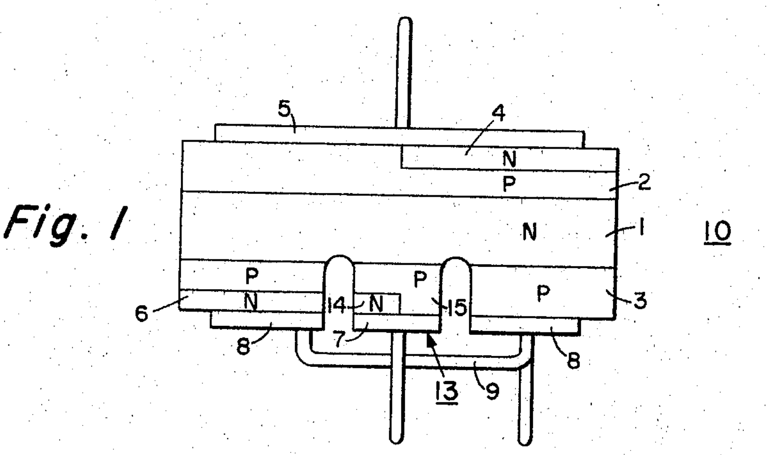
FIGURE 1 depicts the bilateral triode switch having contiguous P- and N-type conductivity regions of the island shorted together.
Figure 2:
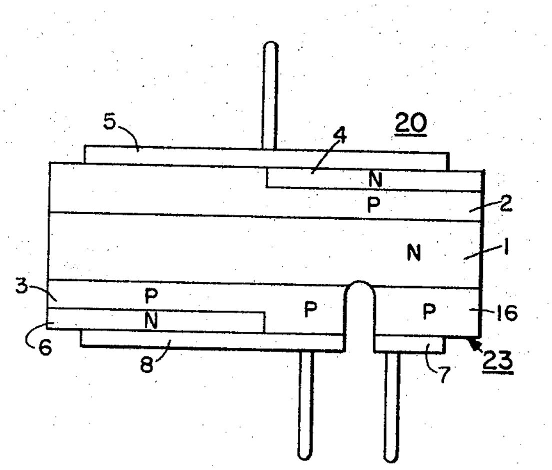
FIGURE 2 illustrates the bilateral triode switch having solely P-type material in the discrete region.
Figure 3:
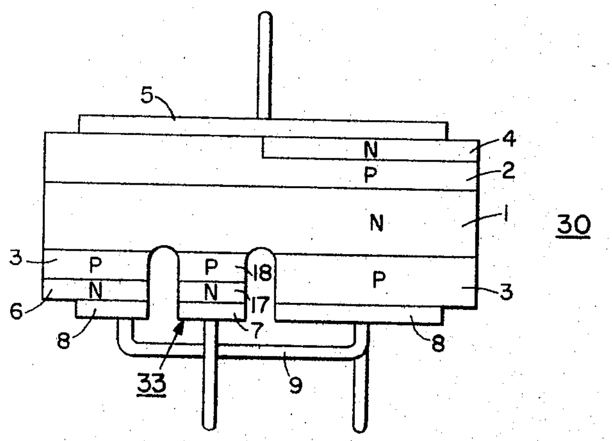
FIGURE 3 illustrates the bilateral triode switch having P- and N-type material in the island without electrical shorting between the different types.

Referring generally to FIGURES 1 through 3, the bilateral triode switch semiconductor device is essentially an N-type, double diffused, multilayer silicon device which may take the form of a circular wafer, bar or any desired configuration; however, for simplicity of description a circular wafer will be considered. Opposite sides of the N-type wafer are diffused with P-type conductivity impurities as would generally be performed in making a transistor. Next, regions of each P-type diffused layer are diffused with N-type impurities making a planar outer surface of P- and N-type material. On one surface of the wafer a moat or circular channel is etched therein penetrating to the initial N-type material of the wafer. The moat or channel isolates a plateau surface or island region of the device, the island being contiguous with the initial N-type material. In this manner there has been formed the bilateral triode switch having an island electrode, an adjacent electrode across the moat or channel therefrom and an opposite electrode on the surface of the wafer opposite the island electrode. Contacts are made to each of the three electrodes, with the mesa electrode acting as the control for the bilateral triode switch and the adjacent electrode and opposite electrode acting as the load current carrying portion of the device, hereinafter sometimes referred to as the main device. The multilayer semiconductor region between the island electrode and either the adjacent or opposite electrode operates as a small switch device with a breakover voltage lower than the breakover voltage required between the adjacent and opposite electrodes. In this manner by supplying a control voltage between the island and adjacent electrodes, the little switch device having a potential drop exceeding the breakover value conducts current and establishes a field which aids in achieving breakover voltage between the adjacent and opposite electrodes thereby supplying power to a load which is in series with the bilateral triode switch and the load voltage supply.

Referring specifically to FIGURE 1, there is illustrated a preferred arrangement of the bilateral triode switch generally referred to by the numeral 10. The device consists of a center region or main base 1 of N-type material. Diffused regions 2 and 3 of P-type conductivity are illustrated on opposite sides of the center region or base 1. An N-type diffused region 4 covering about half of the upper surface of device 10 is diffused into region 2 leaving a planar surface of N- and P-type conductivity material. Similarly, a diffused P-type region 3 is provided in device 10 with a second diffused N-type region 6 covering about half of the lower surface of device 10 in planar relation to region 3. A channel or moat of generally circular configuration is etched through regions 6 and 3 and into region 1 to form an island or plateau generally designated 13. Part of region 6 becomes region 14 and part of region 3 becomes region 15 of island 13. Electrical contact 5 shorts region 4 and 2, contact 8 shorts regions 3 and 6, and electrical contact 7 shorts the N- and P-type regions of island 13. Alternatively, lead 9 may externally short regions 6 and 3. Thus it will be observed that a multilayer device exists between island 13 (N-type region 14 and P-type region 15) and N-type region 1, P-type region 3 and N-type region 6. Also, a multilayer device exists between regions 6, 3, 1, 2 and 4.

Referring to FIGURE 2, there is illustrated a bilateral triode switch similar to the one depicted in FIGURE 1 wherein like reference numerals indicate like areas of the device. The bilateral triode switch generally designated 20 is formed in a similar manner as bilateral triode switch 10 except that a P-type region 16 of region or layer 3 is isloated by etching a channel or moat to form generally a pie-slice-shaped configuration through region 3 into region 1 creating the island, generally designated 23.

Referring specifically to FIGURE 3, there is illustrated a third configuration for the bilateral triode switch, generally designated 30, wherein like numerals indicate like areas of bilateral triode switch 10 and 20. In this device a moat or channel is etched through region 6 and 3 into region 1 to form an island generally designated 33 containing an isolated N-type region 17 and a P-type region 18. Again it will be noticed that a small multilayer semiconductor device exists between island 33 (N-type region 17 and P-type region 18) and N-type region 1, P-type region 3 and N-type region 6. Also, the main device exists between electrode 8, which is shown externally shorted by lead 9 or may be a portion of the same contact region of the device, and electrode 5. A second small device exists between electrode 5 and island 33.

In all three embodiments of the bilateral triode switch when the mesa or control electrode is provided with an appropriate voltage differential between the adjacent electrode, the island to adjacent or opposite electrode multilayer semiconductor device will begin conducting at its breakover voltage and the current plus the field established by the island device breakover will establish breakover of the adjacent to opposite electrodes or main device thereby switching power applied to the adjacent and opposite electrode through a load. It will be apparent from the construction of the device and its general operation that it may be utilized as a synchronous switch or in other applications, yet in all events avoid the necessity of supplying the load current through the control electrode as is commonly done in four layer and five layer devices.

Furthermore, the control input electrode has been referred to as an island electrode. This designation is deemed appropriate although it is only necessary that the control electrode be a discrete region of the bilateral triode switch contiguous solely with a floating main base region of the bilateral triode switch device.

The symmetrical bilateral triode switch of the invention may be contructed using techniques and methods which are generally known to those skilled in the art. The description hereinafter will provide the additional information appropriate to produce the bilateral triode switch device in the desired configuration.

Preferably, the starting semiconductor material for the bilateral triode switch was an N-type silicon wafer 50 to 100 mils in diameter and 6 to 10 mils thick having a starting resistivity of 2 to 4 ohms-cm. with a 1:1:1 plane orientation (all measurements of the apparent resistivity were made by the well known 4-point probe technique with 50 mil spacing). The wafer was oxidized in steam for about 4 hours at about 1200° C. The wafer was then Ga diffused at about 1200° C. for 24 hours in an open tube diffusion. The Ga source was $Ga_2O_3$ at about 850° C. with 2 liters per minute of hydrogen carrier gas flowing at a 0° C. dew point thereover. The P-type layer was about 1.2 mils deep and had an apparent resistivity of 10 ohms-cm. The oxide was leached from the wafer with HF and, the wafer again steam oxidized as above. Using Kodak Metal Etch Resist (KMER) and a suitable mask, the oxide was selectively removed to permit N-type diffusion for the required configuration of the bilateral triode switch. The N-type diffusion was accomplished by using phosphorus in the form of $P_2O_5$ as the source. The source, $P_2O_5$, was heated to about 400° C. and oxygen at 2 liters per minute was used as a carrier gas. The wafer was maintained at about 1200° C. and diffusion was conducted for about 45 minutes. The phosphorous diffusion resulted in an N-type layer 0.4 mil deep and produced an apparent resistivity of 0.2 to 0.4 ohm-cm. The oxide and glaze (from the N-type diffusion) were removed with HF. The wafer was then plated to provide ohmic contact. Using KMER and a suitable mask, the island was etched into the wafer. In this manner the bilateral triode switch was completed with the desired configuration. The above describes the preferred technique for making the bilateral triode switch, however, this is merely illustrative of many techniques which may be used as will be appreciated by those skilled in the art.

Figure 4:
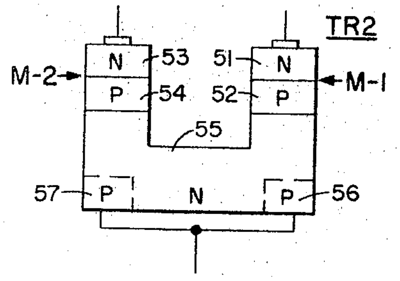
FIGURE 4 illustrates the logic circuit dual island semiconductor device.

Referring now to FIGURE 4, there is depicted the dual mesa transistor TR–2 having measas M–1 and M–2. Preferably TR–2 is made from a silicon semiconductor of N-type conductivity. Transistor TR–2 has a common collector region 55, a base 52 and emitter 51 in mesa M–1 and a base 54 and emitter 53 in mesa M–2. When the reverse bias of the PN junctions 52–51 or 53–54 exceeds about 5 volts, the breakover voltage, current flows from mesa M–1 or M–2, respectively to the common collector with about a 5 volt drop. When the reverse bias of PN junctions 52–55 or 54–55 reaches breakback or snapback voltage (which may be 30 to 50 volts or more), current begins to flow from the common collector 55 to mesa M–1 or M–2, respectively, initially at the breakback voltage, then at perhaps half of the initial breakback voltage level. The lower level of voltage drop may be further decreased by the optional inclusion of P-type regions 56 for mesa M–1 and 57 for mesa M–2 in the common collector 55. Regions 56 and 57 are illustrated in dashed lines.

The device TR–2 may be made by any of the well known techniques. Preferably, N-type silicon having a starting resistivity of 0.026 to 0.040 ohm-cm. and a 1:1:1 orientation was used as the starting wafer. The process steps hereafter described are identical as those for making the triode thyristor previously described with exceptions noted. The wafer was steam oxidized and gallium diffused with the penetration being 0.8 mil. The oxide was removed and the wafer was then phosphorus diffused to produce an 0.4 mil N-type layer with the 0.2 to 0.4 ohm-cm. apparent resistivity. These steps produced an NPNPN structure. The glaze was removed with HF. The wafer was masked on one side and the N and P layers on the unmasked side were etched off leaving an NPN structure. The exposed N surface was plated for ohmic contact. Using KMER and a suitable mask the dual mesa configuration was formed. The dual mesa transistor was then mounted and leads attached. Of course, if the optional P-type regions are desired in the collector a P-type diffusion of the NPN structure with suitable masking is necessary.

Figure 5:
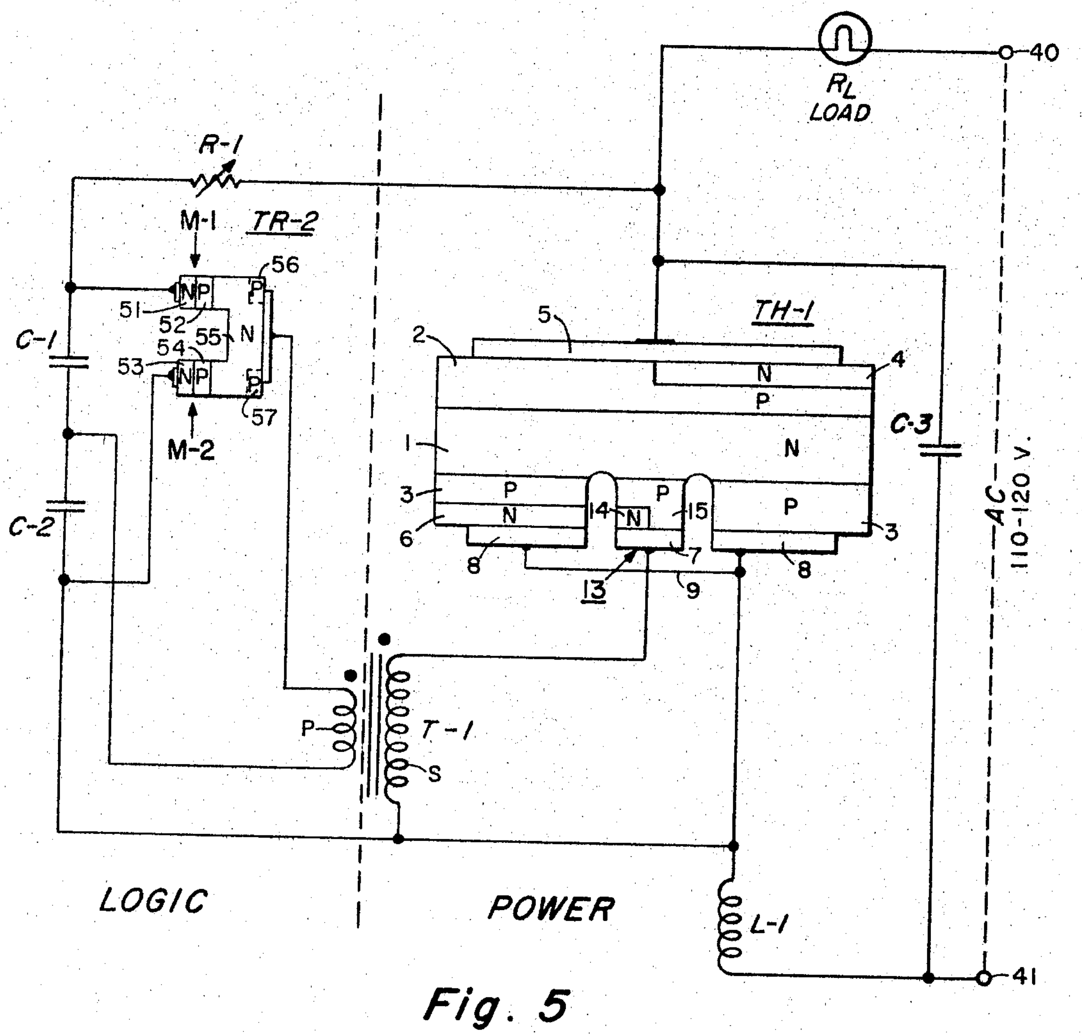
FIGURE 5 is a circuit schematic illustrating the switching circuit with the bilateral triode switch in series with a power load.

Referring specifically to FIGURE 5, there is illustrated application of the symmetrical bilateral triode switch in the switching circuit appertaining thereto as a light dimmer control. A.C. voltage is supplied to the power line at inputs 40 and 41. In parallel with the line beginning at input 40 is a series circuit including load $R_L$ and bilateral triode switch TH–1, having the main series path between contact 5 and contact 8 of the triode thyristor. Electrode or contact 8 is connected in the series circuit to input 41 through inductor L–1. Capacitor C–3 shunts the junction of load $R_L$ and contact 5 to the junction of input 41 and the lower end of inductor L–1. The elements L–1 and C–3 form a hash filter for the circuit. Island 13 by electrode 7 is connected through coil S of T–1 to the top of inductor L–1. Coil S forms the input impedance for island 13. The heretofore described circuit is considered the power circuit although coil S of T–1 is the inductive coupled output of the switching circuit yet to be described.

The switching circuit comprises the series circuit from the junction between load RL and contact 5 through potentiometer R–1, capacitor C–1, capacitor C–2 and inductor L–1 to input 41. The junction between potentiometer R–1 and capacitor C–1 is shunted to the junction of capacitor C–1 and capacitor C–2 by the series circuit consisting of mesa M–1 to the common collector of transistor TR–2, coil P of transformer T–1, thence to the junction of capacitors C–1 and C–2. The junction of coil S, inductor L–1 and capacitor C–2 is connected to the junction of capacitors C–1 and C–2 by a series circuit containing mesa M–2 to the common collector of transistor TR–2 to coil P, thence to the junction of C–1 and C–2.

In functioning, the switching circuit may be considered as a phase shift network and a pulse forming network. The phase shift network is the charging circuit for the pulse forming network. Considering a positive voltage at input 40, the phase shift network comprises potentiometer R–1, the zener breakdown of the emitter 51 to base 52 of mesa M–1, coil P and capacitor C–2. The pulse network is then capacitor C–2, coil P and mesa M–2 at the junction of base 54 with the common collector 55. Capacitor C–2, when charged to the breakback voltage of base 54 to collector 55 junction of mesa M–2, discharges through this junction impressing a voltage pulse across coil P.

Figure 6:
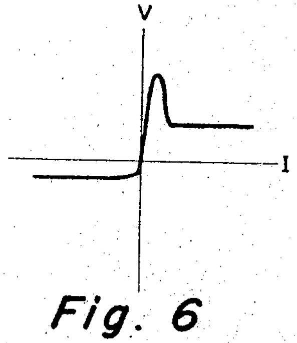
FIGURE 6 illustrates the voltage-current relationship in the output of the switching circuit utilizing the dual mesa transistor across the starting impedance of the bilateral triode switch.
Figure 7:
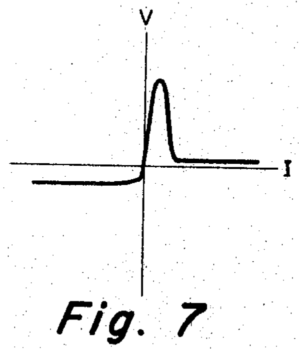
FIGURE 7 depicts the voltage-current relationship in the output of the switching circuit utilizing the dual mesa device including the additional P-type regions in the collector.

In more detail, the operation of the switching circuit to turn on the bilateral triode switch and apply power to load RL is achieved in the following manner: When input 40 goes positive, current flows through R–1, C–1 and C–2 to input 41, the emitter 51 to base 52 junction of mesa M–1 becomes reversed biased while base 52 to common collector 55 junction of mesa M–1 is forward biased. Hence, no current flow occurs through mesa M–1. As the voltage on C–1 at the junction with M–1 increases to about 5 volts, or so, the breakover voltage of emitter 51 to base 52 junction of M–1 is exceeded and current will flow through M–1 to common collector 55 of TR–2, through coil P of transformer T–1 to the junction of capacitor C–1 and C–2, thus effectively clamping the voltage drop across capacitor C–1 at the breakdown voltage of the reverse biased emitter 51 to base 52 junction of mesa M–1. The emitter 53 of mesa M–2 is at ground potential, hence, as the voltage rises across C–2 emitter 53 to base 54 junction of mesa M–2 is forward biased whereas base 54 to common collector 55 junction of M–2 is reverse bias. When the voltage appearing across C–2 rises to breakback or snapback voltage of base 54 to collector 55 junction of mesa M–2, a voltage pulse appears across coil P of transformer T–1. Because of the snapback or breakback action, the voltage necessary to keep mesa M–2 of TR–2 conducting to common collector 55 is approximately half of the initial breakback voltage. The V–I curve, FIGURE 6, illustrates the pulse developed in coil P of transformer T–1 when breakback voltage is reached. FIGURE 7 illustrates the V–I curve when the dual mesa device with additional P-type regions 56 and 57 in common collector 55 is utilized in the switching circuit.

The switching circuit voltage pulse appearing across coil P is transmitted as a negative pulse, with a predetermined phase relation to the line voltage, to island 13 of bilateral triode switch TH–1. When the switching circuit pulse is coupled to island 13 of TH–1 in conjunction with the line voltage, the breakover voltage of TH–1 is exceeded, causing the bilateral triode switch to assume its low impedance state and conduct current to load $R_L$.

For more detail in operation of the bilateral triode switch TH–1, consider the application of a line voltage between input 40 and 41 placing a voltage plus $V_T$ at contact 5. The effect of plus $V_T$ at contact 5 is to reverse bias PN junctions 1–15 and 1–3 and at the same time to forward bias PN junctions 2–1, 15–14, and 3–6, shorted junction 2–4 will not sustain reverse bias. Under these conditions a current $I_{01}$ (the reverse saturation current due to plus $V_T$) flows from contact 5 in part to contact 8 and in part to contact 7 of island 13. Since the applied voltage plus $V_T$ to contact 5 is never sufficient to break down reverse biased junctions 1–15 and 1–3, the bilateral triode switch will remain in its high impedance state. Further, consider the application of a controlled phase relation pulse of minus $V_m$ at contact 7 of island 13. The switching circuit voltage minus $V_m$ applied to island 13 establishes a potential drop from contact 8 through the bilateral triode switch to contact 7. The effect of applying minus $V_m$ to island 13 is to reverse bias PN junctions 1–15 and 3–6 and forward bias PN junctions 14–15 and 1–3. Also, minus $V_m$ establishes a current, $I_{02}$ (the reverse saturation current) from contact 8 to 7.

At the time minus $V_m$ is applied to island 13, the potential drop from contact 5 to the island electrode 7 establishes a reverse bias at the PN junction 1–15 which exceeds the avalanche breakdown voltage, $V_Z$, and the current from contact 5 to contact 7 begins to greatly exceed the saturation current attributable to $I_{01}$ and $I_{02}$ switching the island to contact 5 path or small device to the low impedance state. This low impedance effectively places plus $V_T$ at contact 7. Hence, substantially all of plus $V_T$ appears across coil S of T–1 since the load affords very small resistance in proportion to the impedance or D.C. resistance of coil S. Once plus $V_T$ appears at contact 7, a strong field is established across junction 1–3. With the large number of holes in region 1 flowing near junction 1–3 because of the heavy current through the island device, the breakover potential of junction 1–3 is exceeded thereby establishing substantial current flow from contact 5 to contact 8 thus switching the main device (contact 5 to contact 8) to the low impedance state. Now, the resistance between contact 8 to inductor L–1 is much less than the resistance of coil S appearing between the island and inductor L–1, therefore, substantially all the load current flows through thyristor TH–1 from contact 5 to contact 8, effectively switching starting impedance coil S of transformer T–1 automatically out of the load circuit.

On the negative half cycle of the line voltage, minus $V_T$ appears at contact 5 and a starting voltage, plus $V_M$, appears as an input to island 13. Before plus $V_M$ appears at island 13, minus $V_T$ is applied to power contact 5, thus forward biasing PN junction 1–3, 1–15 and 2–4, while reverse biasing PN junctions 2–1, shorted junctions 15–14 and 3–6 will not sustain reverse bias. When the switching circuit output produces plus $V_M$ at island 13, PN junction 1–3 and 1–2 are reversed biased thereby and PN junctions 1–15 and 2–4 are forward biased thereby. Hence, reverse saturation current, $I_{01}$, attributable to minus $V_T$ flows to contact 5 partly from contact 7 and contact 8; whereas, reverse saturation current, $I_{02}$, attributable to plus $V_m$ flows from contact 7 partly to contact 8 and partly to contact 5.

With PN junction 1–2 reversed biased by minus $V_T$ and plus $V_m$, at the instant plus $V_m$ reverse biases PN junction 1–2 sufficiently, the avalanche breakdown voltage of junction 1–2 is exceeded. Since PN junctions 1–15 is forward biased, the semiconductor device or path between island 13 and contact 5 switches to the low impedance state effectively placing contact 7 at minus $V_T$, producing a highly increased forward bias of PN junction 1–3 for injection of minority carriers from region 3 into region 1 thereby establishing the low impedance state in the main device existing between power contacts 8 and 5, or switching bilateral triode switch TH–1 to the low impedance state. As occurs during the positive half cycle coil S, when TH–1 assumes the low impedance state, affords high impedance to current, hence substantially all the load current flows between power contacts 5 and 8, effectively switching impedance coil S out of the load circuit.

It will be understood from the above detailed description of the operation of the bilateral triode switch, with the application in one instance of plus $V_T$ to contact 5 and minus $V_m$ to island 13 and in another minus $V_T$ to contact 5 and plus $V_m$ to contact 7 that from similar analysis it will be readily seen that the bilateral triode switch will be switched to the low impedance state between power contacts, whether the island to adjacent power contact switches to the low impedance state before or after or at the same time as the island to opposite power contact. It will be understood that all the bilateral triode switches illustrated in FIGURES 1 through 3, although varying in construction of islands or discrete control regions, will function in a similar manner, and also that the bilateral triode switch might be made using a PNPNP construction.

Although the invention has been described with reference to a silicon NPNPN device other materials such as germanium and the compound semiconductor materials may be readily used in the device of the invention. Likewise, the synchronous switching circuit of the invention may be modified in various aspects as will become readily apparent to those skilled in the art and all such modifications and changes of the synchronous bilateral triode switch appertaining to the invention are deemed to be within the scope of the invention except as necessarily limited by the claims appended hereto.

What is claimed is:

1. A semiconductor bilateral triode switch comprising a body of semiconductor material having five successively contiguous regions, each region forming a PN junction with regions contiguous thereto, a discrete region contiguous solely with the innermost region defining a PN junction therewith isolated from all but the subjacent innermost region, a pair of power contacts, each power contact shunting an outermost region to the region contiguous therewith, and a control electrode contact to the discrete region.

2. A semiconductor bilateral triode switch comprising a body of semiconductor material having a central region, an intermediate region and an outer region on each side of the central region, the intermediate regions of opposite-type conductivity than the central region and outer regions and each intermediate region forming a PN junction with the outer region contiguous therewith, an island region forming a PN junction exclusively with the subjacent central region, a pair of power contacts each shunting contiguous intermediate and outer regions along the PN junction therebetween, and a control electrode contact to an island region.

3. A semiconductor bilateral triode switch comprising a body of semiconductor material having a central region, an intermediate region and an outer region on each side of the central region, the intermediate regions of opposite-type conductivity than the central region and outer regions, an island region contiguous exclusively with the subjacent central region forming a PN junction therebetween, and an electrical contact to the island region, a pair of power contacts each shunting adjacent intermediate and outer regions, said semiconductor device switching from high impedance to low impedance between the pair of power contacts at a desired bias level when a signal voltage is applied to the island region.

4. A semiconductor bilateral triode switch comprising a body of semiconductor material having five successively contiguous regions, each region forming a PN junction with regions contiguous thereto, an island region contiguous solely and exclusively with the subjacent innermost region along a PN junction therewith, a pair of power contacts, each power contact shunting an outermost region to the region contiguous therewith, and an electrical contact to the island region, said semiconductor device switching from high impedance to low impedance between the pair of power contacts at a desired bias level when a signal voltage is applied to the island region.

5. A semiconductor bilateral triode switch comprising a single crystal semiconductor body having a center region of one conductivity type, intermediate regions on each side of the center region contiguous therewith of opposite-type conductivity and outer regions contiguous with each intermediate region of the same conductivity as the center region, an island region defined within said body contiguous exclusively with the subjacent center region and non-contiguous with the intermediate and outer regions of said body, an electrical contact on said island region providing an input control electrode, a pair of electrical power contacts, each contact of said pair shorting one P–N junction between contiguous intermediate and outer regions of the semiconductor body.

6. A bilateral triode switch comprising a semiconductor body having a central region of one-type conductivity, a pair of intermediate regions of opposite-type conductivity, each intermediate region contiguous with one side of the central region, and a pair of outer regions of like conductivity as the central region, each outer region contiguous with one of said intermediate regions, a pair of electrical power contacts each one of said pair of power contacts shorting one said intermediate region to the outer region contiguous therewith, an island formed in one surface of said device containing at least an isolated part of one of said intermediate regions, the base of the island being contiguous solely and exclusively with the subjacent central region of said body, and an electrical contact on the surface of said island for applying an input signal thereto.

7. A bilateral triode switch circuit for controlling power to a load comprising a semiconductor bilateral triode switch having a central region of one-type conductivity, a pair of intermediate regions of opposite-type conductivity, each intermediate region contiguous with one side of the central region, and a pair of outer regions of like conductivity as the central region, each outer region contiguous with one of said intermediate regions, a pair of electrical power contacts, each power contact shorting one said intermediate region to the outer region contiguous therewith, an island formed in one surface of said switch containing at least an isolated part of one of said intermediate regions, the base of the island being contiguous solely with the central region of said switch, and an electrical contact on the surface of said island; a load in series with said triode switch through the power contacts thereof; an impedance circuit in series with said electrical contact and one of said power contacts for applying an input to said triode switch; a source of A.C. power applied across said load and said triode switch at said one of said power contacts; and a switching circuit in parallel with said triode switch for generating a synchronous starting signal comprising a phase shift network for varying the phase of said source of A.C. power in the switching circuit and a pulse generating network coupled to said impedance circuit for developing the synchronous starting signal in said impedance circuit responsive to the voltage of said phase shift network.

8. A semiconductor bilateral triode switch circuit for controlling power to a load comprising a semiconductor bilateral triode switch having five successively contiguous regions, each region forming a PN junction with regions contiguous thereto, an island region contiguous solely with the innermost region through a PN junction, a pair of power contacts, each power contact shunting an outermost region to the region contiguous therewith, and a control electrode contact to the island region; a load in series with said triode switch through the power contacts thereof; an impedance circuit in series with the control electrode and one of said power contacts for applying an input to said triode switch; a source of A.C. power applied across said load and said triode switch at said one of said power contacts; and a switching circuit in parallel with said triode switch for generating a synchronous starting signal comprising a phase shift network for varying the phase of said source of A.C. power in the switching circuit and a pulse forming network coupled to said impedance circuit for developing the synchronous starting signal in said impedance circuit responsive to the voltage in said switching circuit.

9. A bilateral triode switch circuit for controlling power to a load comprising a semiconductor triode switch device containing five successively contiguous regions, alternate regions being of opposite-type conductivity than regions contiguous therewith, a discrete region contiguous solely with the innermost region along a PN junction, a pair of power contacts, each power contact shunting an outermost region to the region contiguous therewith, and a control electrode contact to the discrete region; a load in series with said semiconductor triode switch device between the power contacts thereof; an input impedance circuit coupling said control electrode to one of said power contacts for applying a switching signal to said triode switch device; a source of A.C. power across said load and said one of said power contacts; and a source of switching signals of a predetermined phase relation to said source of A.C. power, said source of signals when applied to said impedance circuit effective to switch said triode switch device from a high impedance to a low impedance state.

10. A semiconductor bilateral triode switch circuit for furnishing power to a load comprising a semiconductor bilateral triode switch device containing five successively contiguous regions, alternate regions being of opposite-type conductivity than regions contiguous therewith, a discrete region contiguous solely with the innermost region along a PN junction, a pair of power contacts, each power contact shunting an outermost region to the region contiguous therewith, and a control electrode contact to the discrete region; a load in series with said triode switch device between the power contacts thereof; an impedance circuit coupling said control electrode to one of said power contacts for applying an input to said triode switch device; a source of A.C. power across said load and said one of said power contacts; and a source of input starting signals of a predetermined phase relation to said source of A.C.

power, said source of signals when applied to said impedance circuit effective to switch said triode switch device from a high impedance to a low impedance state between said discrete region and either of said power contacts and thereafter to switch said triode switch device from the high to the low impedance state between said power contacts, thereby shunting said impedance circuit out of the load power circuit.

11. A semiconductor triode device power control circuit comprising a semiconductor triode device containing five successively contiguous regions, alternate regions being of opposite-type conductivity than regions contiguous therewith, a discrete region contiguous solely with the innermost region, a pair of power contacts, each power contact shunting an outermost region to the region contiguous therewith, and a control electrode contact to the discrete region; a load in series with said semiconductor triode device between the power contacts thereof; an impedance circuit coupling said control electrode to one of said power contacts for applying an input to said triode device; a source of A.C. power across said load and said one of said power contacts; a switching circuit for generating an input starting signal of a predetermined phase relation to said source of A.C. power comprising a series circuit in parallel with said triode device comprising a variable resistance device, a first capacitor and a second capacitor, a circuit shunting said first capacitor comprising a first non-linear impedance device conductive at one voltage level when biased in one direction and conductive initially at a higher level than said one voltage level and then at another level below said higher level when biased in the opposite direction, and an inductor in series with said first non-linear impedance device, a circuit shunting said second capacitor comprising a second non-linear impedance device, conductive at said one voltage level when biased in one direction and initially conductive at said higher level and then at said another level when biased in the opposite direction, and said inductor in series with said second non-linear impedance device, said switching circuit coupling the voltage pulses generated in said inductor to said impedance circuit whereby said voltage pulses are effective to create a low impedance between said discrete region and either of said power contacts, said low impedance state further effective to change the high impedance state between said pair of power contacts to a low impedance state effectively shunting said impedance circuit out of the power circuit.

12. A semiconductor triode device power control circuit comprising a semiconductor triode device containing five successively contiguous regions, alternate regions being of opposite-type conductivity than regions contiguous therewith, a discrete region contiguous solely with the innermost region along a PN junction, a pair of power contacts, each power contact shunting an outermost region to the region contiguous therewith, and a control electrode contact to the discrete region; a load in series with said semi-conductor triode device between the power contacts thereof; an impedance circuit coupling said control electrode to one of said power contacts for applying an input to said triode switch; a source of A.C. power across said load and said one of said power contacts; a switching circuit for generating a pulse train of switching signals of a predetermined phase relation to said source of A.C. power comprising a variable resistance device, a first capacitor and a second capacitor coupled in a series circuit across said triode device, a non-linear impedance device having a common electrode and two discrete portions, each portion having an electrical contact, said non-linear impedance device electrically conductive in one direction at one biased level in said one direction between either of said discrete portions and said common electrode, and conductive in the other direction between either of said discrete portions and said common electrode at an instantaneously higher level than said one bias level and thereafter at another level below said higher level in the other direction, said common electrode couple between said first and said second capacitors through a common inductor, one of said discrete portions coupled to one of said first and second capacitors in series with said inductor to form a first shunt path thereover and the other of said discrete portions coupled to the other of said first and second capacitors in series with said inductor to form a second shunt path thereover, whereby said non-linear impedance device in conjunction with said first and said second capacitors produces an output pulse train of starting signals across said inductor in a preselected phase relation to said source of A.C. power, said switching circuit inductively coupled to said impedance circuit for applying said switching signals to said control electrode.

13. A switching circuit for developing a series of pulses having a predetermined phase relation to an A.C. power source comprising the source of A.C. power, a series circuit across said source of A.C. power comprising a variable resistance device, a first capacitor and a second capacitor, a circuit shunting said first capacitor comprising a first non-linear electrical impedance path conductive at one voltage level when biased in one direction and conductive initially at a higher level than said one voltage level and then at another level below said higher level when biased in the opposite direction and an inductance in series with said first non-linear electrical impedance path, a circuit shunting said second capacitor comprising a second non-linear electrical impedance path conductive at said one voltage level when biased in one direction and initially conductive at said higher level and then at said another level and said inductance in series with said second non-linear electrical impedance path, said switching circuit producing pulses across said inductance in synchronization with said source of A.C. power at a predetermined phase relation thereto.

14. A switching circuit for developing a series of output pulses having a predetermined phase relation to a source of A.C. power comprising the source of A.C. power, a series circuit across said source of A.C. power comprising a variable resistance device, a first capacitor and a second capacitor said first capacitor and said second capacitor having a common junction, a non-linear impedance device having a common electrode and a pair of discrete regions each having an electrical contact thereto, one of said electrical contacts connected to the non-common junction of said first capacitor and the other of said electrical contacts connected to the non-common junction of said second capacitor, an inductor coupling said common junction to said common electrode, said non-linear impedance device conductive in one direction when biased in said one direction at one voltage level and conductive in the other direction when biased in said other direction at an initially higher level than said one level and then at another level below said higher level, said non-linear impedance device effective to clamp one of said first capacitor and second capacitor at said one voltage level and to allow charging the other capacitor to said initially higher level thereby generating a step pulse voltage output in said common inductor having a preselected phase relation with said source of A.C. power.

15. A switching circuit for generating an output pulse comprising a source of A.C. power; a variable resistor, a first capacitor and a second capacitor coupled in a series circuit across said source of A.C. power; a non-linear impedance device having a common electrode and two discrete regions, each region having an electrical contact, said non-linear impedance device electrically conductive in one direction at one bias level in said one direction between either of said discrete regions and said common electrode, and conductive in the other direction between either of said discrete regions and said common electrode at an instantaneously higher level and thereafter at least at as low a level of bias as said one bais level in the other direction, said common electrode coupled between said first and second capacitors through a common inductor, one of said discrete regions coupled to one of said first and second capacitors in series with said inductor to form a first shunt path thereover and the other of said discrete regions coupled to the other of said first and second capacitors in series with said inductor to form a second shunt path thereover, whereby said non-linear impedance device in conjunction with said first and said second capacitors generates an output pulse train across said inductor in a preselected phase relation to said source of A.C. power.

16. A semiconductor bilateral triode switch comprising a single crystal body of semiconductor material having five contiguous regions of alternate conductivity type forming a plurality of P–N junctions, each outermost region and region contiguous thereto having a common, intimate power contact over at least a portion of the PN junction therebetween, a discrete region within said body exclusively contiguous to the subjacent innermost region along a PN junction, said discrete region having an electrical contact thereto to provide a control input electrode, said semiconductor switch when biased in either direction between its power contacts below a breakover bias level switching from the high impedance state to the low impedance state responsive to control signals at a predetermined relation to said bias applied to said input electrode.

References Cited by the Examiner

UNITED STATES PATENTS

| | | | |
|---|---|---|---|
| 3,090,873 | 5/1963 | Mackintosh | 307—88.5 |
| 3,124,703 | 3/1964 | Sylvan | 307—88.5 |
| 3,188,490 | 6/1965 | Hoff et al. | 307—88.5 |
| 3,192,466 | 6/1965 | Sylvan et al. | 307—88.5 |
| 3,196,329 | 7/1965 | Cook et al. | 307—88.5 |
| 3,196,330 | 7/1965 | Moyson | 307—88.5 |

FOREIGN PATENTS

| | | |
|---|---|---|
| 1,267,417 | 6/1960 | France. |
| 1,291,321 | 3/1962 | France. |
| 605,259 | 7/1949 | Great Britain. |

ARTHUR GAUSS, *Primary Examiner.*

B. P. DAVIS, *Assistant Examiner.*